United States Patent
Gelso et al.

(10) Patent No.: US 11,214,150 B2
(45) Date of Patent: Jan. 4, 2022

(54) METHOD AND ARRANGEMENT FOR DETERMINING THE STATE OF CHARGE OF A BATTERY PACK

(71) Applicant: VOLVO TRUCK CORPORATION, Gothenburg (SE)

(72) Inventors: Esteban Gelso, Gothenburg (SE); Hanna Bryngelsson, Gothenburg (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 179 days.

(21) Appl. No.: 16/470,740

(22) PCT Filed: Jan. 9, 2017

(86) PCT No.: PCT/EP2017/050338
§ 371 (c)(1),
(2) Date: Jun. 18, 2019

(87) PCT Pub. No.: WO2018/127296
PCT Pub. Date: Jul. 12, 2018

(65) Prior Publication Data
US 2019/0339333 A1    Nov. 7, 2019

(51) Int. Cl.
*B60L 3/12*    (2006.01)
*G01R 31/3835*    (2019.01)
(Continued)

(52) U.S. Cl.
CPC .......... *B60L 3/12* (2013.01); *G01R 31/31912* (2013.01); *G01R 31/367* (2019.01);
(Continued)

(58) Field of Classification Search
CPC .. B06L 3/12; B06L 2220/18; B06L 2240/545; B06L 2240/547; B06L 2260/44;
(Continued)

(56) References Cited

U.S. PATENT DOCUMENTS

2012/0041698 A1* 2/2012 Zhang ................ G01R 31/3842
702/63
2012/0326726 A1 12/2012 Tabuchi et al.
(Continued)

FOREIGN PATENT DOCUMENTS

DE  102015108294 A1  12/2015
EP     2816366 A1  12/2014
(Continued)

OTHER PUBLICATIONS

International Search Report dated Sep. 14, 2017 in International Application No. PCT/EP2017/050338.
(Continued)

*Primary Examiner* — Vuthe Siek
(74) *Attorney, Agent, or Firm* — Venable LLP; Jeffri A. Kaminski

(57) ABSTRACT

The invention relates to a method for determining the state of charge (SOC) of a chargeable battery pack (5) comprising at least one battery cell (5a, 5b, 5c), said method comprising the steps of: providing an initial state of charge value ($SOC_1$) for said battery pack (5); estimating a battery cell voltage value ($V_{est}$) using a cell model (7b) based on input values representing at least a measured voltage ($V_{meas}$) of said battery pack (5); comparing said estimated battery cell voltage value (Vest) with said measured battery cell voltage value ($V_{meas}$) for said at least one battery cell (5a, 5b, 5c); and determining an estimated state of charge value ($SOC_{est}$) to update the state of charge (SOC) from the initial state of charge value ($SOC_1$), based on said comparing step and by using an observer module (7a). According to the invention, the observer module (7a) comprises an influence factor, said influence factor representing errors in the state of charge (SOC) based on the parameterization of said cell model (7b). The invention also relates to an arrangement for determining the state of charge (SOC) of a battery pack (5).

10 Claims, 4 Drawing Sheets

(51) Int. Cl.
*G01R 31/388* (2019.01)
*G01R 31/367* (2019.01)
*G01R 31/319* (2006.01)

(52) U.S. Cl.
CPC ....... *G01R 31/388* (2019.01); *G01R 31/3835* (2019.01); *B60L 2200/18* (2013.01); *B60L 2240/545* (2013.01); *B60L 2240/547* (2013.01); *B60L 2260/44* (2013.01)

(58) Field of Classification Search
CPC .............. G01R 31/3835; G01R 31/388; G01R 31/367; G01R 31/31912; G01R 31/319
See application file for complete search history.

(56) References Cited

U.S. PATENT DOCUMENTS

| | | |
|---|---|---|
| 2013/0027047 A1 | 1/2013 | Yoshioka et al. |
| 2014/0244225 A1* | 8/2014 | Balasingam ....... G01R 31/3842 703/2 |
| 2014/0316728 A1 | 10/2014 | Zhong et al. |
| 2015/0046108 A1 | 2/2015 | Akamine |
| 2015/0244225 A1* | 8/2015 | Ohashi ............... H02K 15/0037 310/180 |

FOREIGN PATENT DOCUMENTS

| | | |
|---|---|---|
| KR | 101399345 B | 5/2014 |
| WO | 2016059126 A1 | 4/2016 |

OTHER PUBLICATIONS

Written Opinion of the International Searching Authority dated Sep. 14, 2017 in International Application No. PCT/EP2017/050338.
Korean Office Action dated Aug. 31, 2020 in corresponding Korean Patent Application No. 10-2019-7021780, 11 pages.
European Communication Pursuant to Article 94(3) EPC dated Aug. 16, 2021 in corresponding European Patent Application No. 17700267.2, 5 pages.

* cited by examiner

METHOD AND ARRANGEMENT FOR DETERMINING THE STATE OF CHARGE OF A BATTERY PACK

TECHNICAL FIELD

The invention relates to a method and arrangement for determining the state of charge (SOC) of a chargeable battery pack.

The invention can be applied in heavy-duty vehicles, such as buses, trucks and construction equipment, and also passenger cars. Although the invention will be described below with respect to a bus, the invention is not restricted to this particular vehicle.

BACKGROUND

In the automotive field, there is an increase in research and development related to propulsion of vehicles with alternative power sources, i.e. power sources being used as alternatives to conventional internal combustion engines. It is known that an internal combustion engine, for example a gasoline engine or a diesel engine, offers high efficiency with relatively low fuel consumption. However, environmental concerns have led to an increase in development of more environmental-friendly vehicles, in particular electrically operated vehicles.

Today, there exist various types of vehicle propulsion systems comprising electric machines. For example, a vehicle can be operated by means of an electric machine solely, i.e. in the form of a fully electric vehicle (EV), or by means of an arrangement comprising both an electric machine and an internal combustion engine. The latter alternative is often referred to as a hybrid vehicle (HEV), and can be utilized in a manner in which an internal combustion engine is used for operating the vehicle while driving outside urban areas whereas the electric machine can be used in urban areas or in environments in which there is a need to limit the discharge of harmful pollutants such as oxides of nitrogen, fossil carbon dioxide and carbon monoxide. A hybrid normally uses a rechargeable battery pack for supplying electric energy to the electric machine.

Furthermore, a vehicle which is operated by means of an internal combustion engine and an electric machine supplied with power from a battery pack which can be recharged by an external mains electricity supply is referred to as a plug-in hybrid electric vehicle (PHEV).

The technology involved in electrically operated vehicles is closely related to the development of electrical energy storage systems and battery-related technology for vehicles. Today's electrical energy storage systems for vehicles may comprise a battery pack with a plurality of rechargeable battery cells which, together with control circuits, form a system which is configured for providing electric power to an electric machine in a vehicle. The battery cells can be restored into a condition involving a full charge through a connection to an external electric power supply. The external power supply can be in the form of the common electric grid power system which can be accessed via a conventional power cord, or can be in the form of other charging arrangements depending on the vehicles involved and the power need for the recharging process.

During charging, a high amount of energy must be fed into the energy storage system in a relatively short time in order to optimize the vehicle's range of driving. For this reason, the actual charging of the energy storage system is suitably implemented through a process in which a control unit on the vehicle requests a charging process to be carried out by means of the external electric power supply. This is carried out after the energy storage system and the external power supply have been electrically connected by means of suitable connector elements.

In the automotive field, an energy storage system normally comprises a battery pack with a large number of battery cells. Using a plug-in hybrid vehicle as an example, a battery pack may for example be of the lithium-ion type. In the event that a 600 V lithium-ion battery pack is used, approximately 200 battery cells connected in series will then be needed to achieve a desired voltage in order to operate the vehicle. The available range for driving the vehicle then depends on certain parameters such as the state of charge (SOC) of the battery pack. The state of charge can be defined as a measure of the remaining electric capacity left in the battery pack at a certain point in time and is an important parameter in order to prevent batteries from being operated during under- or over-charging situations, and to manage the energy in the vehicle in an optimal manner. The state of charge needs to be estimated since no direct measurement is available for this parameter. A value of the state of charge corresponds generally to a fuel gauge function in a vehicle with an internal combustion engine.

The battery pack is furthermore controlled by a battery management unit (BMU) which is configured to maintain the battery pack in proper operating conditions and in order to ensure a long working lifetime of the battery pack.

According to known technology, there exist several ways of determining the state of charge (SOC). A first method relies on a voltage based state of charge estimation in which a voltage of a battery cell is used for calculating a state of charge value. A problem which exists with lithium battery cells is that such a battery cell exhibits only a small change in voltage over most parts of its charge and discharge cycle. As a result, there is a risk that the state of charge estimation becomes relatively inaccurate.

A further method of determining a state of charge (SOC) value relies on a process of measuring an electric current passing through the battery pack. By integrating the electric current, a measurement of the charge which is drawn out of the battery pack can be obtained. However, a disadvantage with this method is that it depends on actually discharging the battery pack in order to know how much it is charged or discharged. Also, current integration is generally not so accurate since an electric current sensor and the amount of electric current which is fed into and out of the battery pack may cause inaccuracies. Electric current integration is consequently not always accurate enough for a battery pack in a vehicle.

In summary, it is previously known to that there is a need to optimize the monitoring and control of the state of charge (SOC) function within a battery management unit for a vehicle. In order to achieve this, there is a need for methods and systems for determining and updating an accurate value of the state of charge.

The US patent application US 2015/0046108 discloses a method and a system for estimating the state of charge (SOC) of a chargeable secondary cell, i.e. a battery unit. The method comprises three different models for determining a battery cell voltage and for comparing it with a measured voltage value, wherein an optimum model is selected and is used for estimating the cell status of said secondary cell. Furthermore, in order to estimate the state of charge (SOC) of the cell, a Kalman filter is used for correcting an estimated state of charge value.

Even though US 2015/046108 teaches an improved method and system for determining a state of charge value of a battery pack, there are still requirements for further improvements in systems and methods in order to estimate the state of charge of a battery pack in an accurate manner and for controlling and optimizing a state of charge function within a battery management unit in a vehicle.

SUMMARY

An object of the invention is to provide a method and a device in which the state of charge of a battery pack can be determined and controlled in an optimized and accurate manner, in particular by means of a control unit in an electric vehicle.

The above-mentioned object is achieved by a method for determining the state of charge (SOC) of a chargeable battery pack comprising at least one battery cell, said method comprising the steps of: providing an initial state of charge value for said battery pack; estimating a battery cell voltage value using a cell model based on input values representing at least a measured voltage of said battery pack, and a measured temperature of said battery pack; comparing said estimated battery cell voltage value with said measured battery cell voltage value for said at least one battery cell; and determining an estimated state of charge value to update the state of charge (SOC) from the initial state of charge value, based on said comparing step and by using an observer module. Furthermore, according to the invention, the observer module comprises an influence factor, said influence factor representing errors in the state of charge (SOC) based on the parameterization of said cell model.

By providing an observer module comprising the above-mentioned influence factor, the state of charge (SOC) of the battery pack can be determined in an accurate manner and can be controlled by means of an electronic control unit for operating an electric vehicle. In particular, the fact that a cell model is used for describing the operation of a battery cell and that certain parameters of the cell model, for example related to RC circuits forming part of a cell model in the form of an equivalent circuit, are used for defining an influence factor in said observer module, improvements in the process of determining the state of charge can be obtained as compared with the prior art.

The amount of influence from the measured voltage (and possibly also current and temperature values) on the updating of the state of charge, as opposed to the amount of influence from the cell model itself, is determined by means of the influence factor in the observer function. This means that the measured values, on the one hand, and the cell model, on the other hand, can be given different priority during the process for updating the state of charge. Otherwise, if only the measured values are considered when updating the state of charge, there will be inaccuracies due to measurement errors, and if only the cell model is taken into account, there will be inaccuracies due to a need for calibrating the cell model after a certain time. For this reason, the influence factor can be used for an updating process of the state of charge in order to provide a high level of accuracy.

According to one embodiment, the step of estimating a battery cell voltage value may also comprise an input value representing a measured battery current. This may enhance the accuracy of the estimated a battery cell voltage value. According to another embodiment, the step of estimating a battery cell voltage value may also comprise an input value representing a measured temperature of the battery pack. This may enhance the accuracy of the estimated a battery cell voltage value. In a further embodiment, the step of estimating a battery cell voltage value comprises an input value representing a measured battery current and a measured temperature of the battery pack. This may even further enhance the accuracy of the estimated a battery cell voltage value.

According to an embodiment, the estimated battery cell voltage value is compared with the measured battery cell voltage value in a manner so as to update the state of charge (SOC). This process is based on the above-mentioned observer function, as executed in an electronic control unit. Also, as described above, the influence factor is used to control the influence of the measurement values on the one hand, and the cell model on the other hand, during the process of updating the state of charge. The influence factor can be said to represent errors in the state of charge used during the updating process.

According to one embodiment, the update of the state of charge (SOC) value of the battery cell can be limited by means of said influence factor. This means that the estimation process for the state of charge value can be controlled through the selection of the influence factor.

According to an embodiment, the observer module is in the form of a Kalman filter, which is a reliable and efficient process for determining the state of charge. Also, according to an embodiment, the influence factor is determined by a covariance of process noise defined by cell model noise and measurement noise occurring during measuring said current, temperature and voltage of said battery pack. Such a covariance function can suitably be used in the Kalman filter process.

According to an embodiment, the influence factor of the observer function is determined by the errors in the cell model depending on the parameters of the cell model. In particular, the parameterization of the cell model leads to certain errors, primarily in the form of random noise which can be classified into two types, either process noise or measurement noise. The process noise originates from the cell model, for example in the form of noise in RC circuits forming part of the cell model, whereas the measurement noise originates from the actual measurements of the cell terminal voltage, the battery current and the battery temperature.

According to an embodiment, battery cell voltage values are estimated with the cell model based on values representing also a previously estimated state of charge value.

Also, according to an embodiment, the cell model is in the form of an equivalent circuit model including resistors and capacitors, which is a theoretical model of a battery cell which can be used for accurate and efficient calculations in the control unit when updating the state of charge.

According to an embodiment, the influence factor is controlled based on the temperature of said battery pack. Stated differently, the influence factor may be calculated as a function of the temperature of the battery pack. In particular, the fact that the parameterization of the cell model is used to determine the influence factor can for example be used to adapt the influence factor to the temperature of the battery pack. For example, if the battery pack has a relatively low temperature, the influence factor is set so that the influence from the cell model on the updating of the state of charge is relatively low. In other words, the measurements are trusted more than the cell model. On the other hand, if the battery pack has a relatively high temperature, the influence factor is set so that the influence from the cell model on the updating of the state of charge is relatively high. Generally, the influence factor in the observer function can be used for limiting the update of the state of charge value.

Also, the influence factor can be controlled based on the temperature of said battery pack in a manner so that relatively large adjustments to the estimated state of charge (SOC) are allowed at a predetermined temperature interval. In this manner, a temperature interval can be selected for allowing such large adjustments.

The above-mentioned object is also obtained by means of an arrangement for determining the state of charge (SOC) of a chargeable battery pack comprising at least one battery cell. The arrangement comprises: a sensor unit for providing measured values representing a measured voltage of said battery pack; a control unit connected to said sensor unit and being configured for providing an initial state of charge value and for estimating a battery cell voltage value using a cell model based on said measured values, and for comparing said estimated battery cell voltage value with said measured battery cell voltage value for said at least one battery cell; and an observer module being associated with said control unit and allowing said control unit to update the state of charge by determining an estimated state of charge value based on said comparing step and by using said observer module. Furthermore, the control unit is configured for controlling said updating by means of an influence factor being used in said observer module, said influence factor representing errors in the state of charge (SOC) based on the parameterization of said cell model.

Further advantages and advantageous features of the invention are disclosed in the following description and in the dependent claims.

BRIEF DESCRIPTION OF THE DRAWINGS

With reference to the appended drawings, below follows a more detailed description of embodiments of the invention cited as examples.

In the drawings.

DETAILED DESCRIPTION OF EXAMPLE EMBODIMENTS OF THE INVENTION

Different embodiments of the present disclosure will be described more fully hereinafter with reference to the enclosed drawings. However, the method and system disclosed herein can be realized in many different forms and should not be construed as being limited to the aspects set forth herein.

Figure 1:
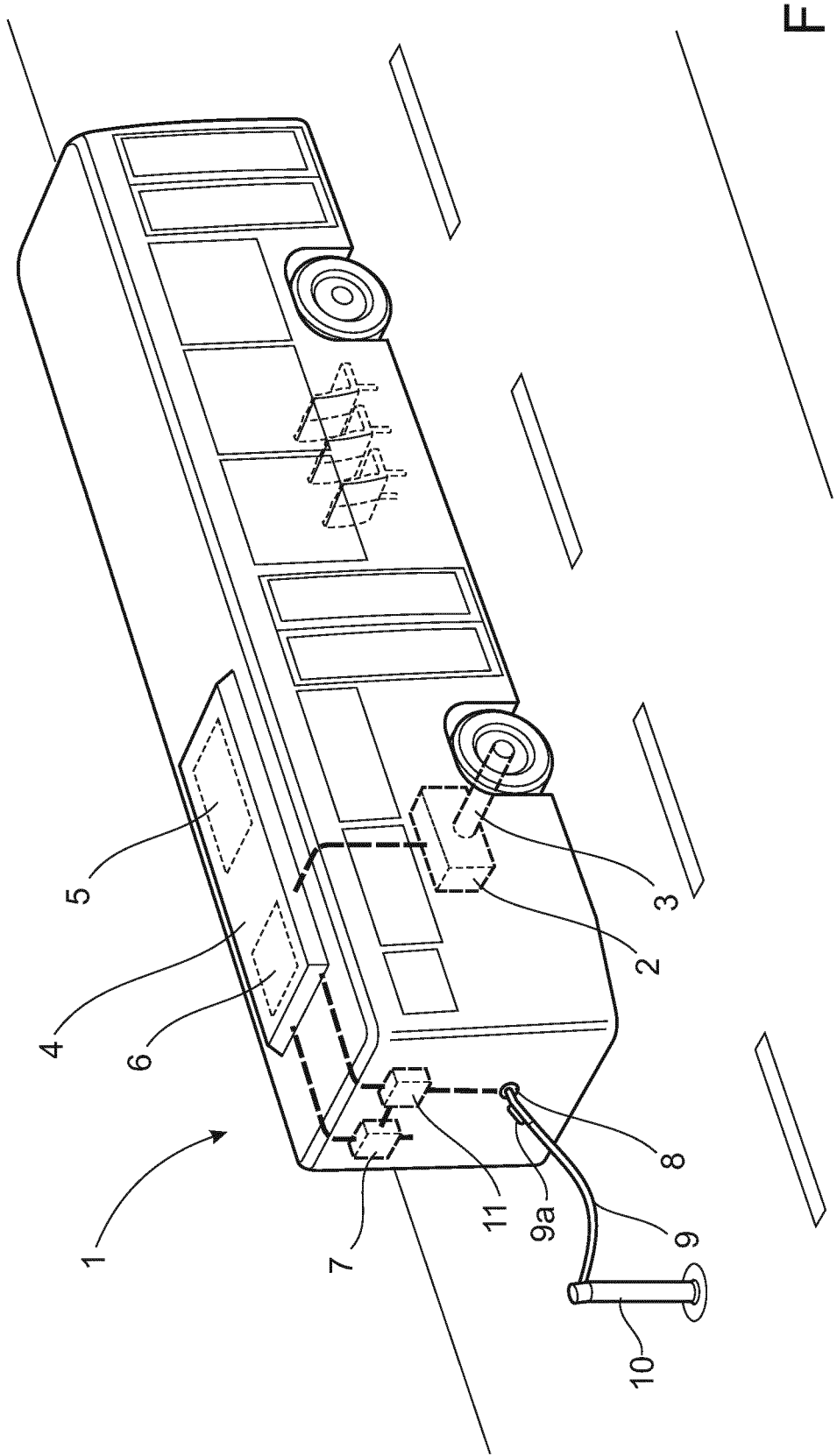
FIG. 1 is a perspective view of an electrically propelled vehicle in the form of a bus, in which the invention can be used.

With initial reference to FIG. 1, there is shown a simplified perspective view of a vehicle in the form of a bus 1 which according to an embodiment is of the electric type which is equipped with an electric machine 2 for operating the bus 1. This is shown schematically in FIG. 1 by means of a rear axle 3 which is connected to the electric machine 2. The electric machine 2 is suitably operated as a combined generator and motor. Also, the vehicle 1 can be in the form of any commercial vehicle or the like, or an automobile.

The bus 1 carries an electric energy storage system 4 comprising a battery pack 5 which will be described in greater detail below and which comprises a plurality of battery cells (not shown in detail in FIG. 1). As will be described in greater detail below, the battery cells are connected in series to provide an output DC voltage having a desired voltage level. Suitably, the battery cells are of lithium-ion type, but other types may also be used. The number of battery cells per battery pack may be in the range of 50 to 500 cells.

The energy storage system 4 also comprises a sensor unit 6 which is arranged for measuring one or more predetermined parameters which are indicative of the state of operation of the battery pack 5. For example, the sensor unit 6 can be configured for measuring the cell voltage (V) of each battery cell as well as the voltage of the entire battery pack 5. Furthermore, the sensor unit 6 can be configured for measuring other parameters such as the battery current (I) or the temperature (T) of the battery pack 5. Other measured parameters are also possible within the scope of the invention.

Measurement data from the sensor unit 6 is transmitted to an electronic control unit 7 which is configured for controlling the electric energy storage system 4 and other relevant components during operation of the bus 1. As will be described in detail below, the electronic control unit 7 can also be configured for determining parameters indicating and controlling the condition or capacity of the battery pack 5, such as the state of charge (SOC), the state of health (SOH) and the state of energy (SOE) of the battery pack 5.

The electronic control unit 7 serves as a battery management unit which may include a microprocessor, microcontroller, programmable digital signal processor or another programmable device. Thus, the electronic control unit 7 comprises electronic circuits and connections (not shown) as well as processing circuitry (not shown) such that the electronic control unit 7 can communicate with different parts of the bus 1 such as the brakes, suspension, driveline, in particular an electrical engine, a clutch and a gearbox in order to at least partly operate the bus 1. The electronic control unit 7 may comprise modules in either hardware or software, or partially in hardware or software, and communicate using known transmission buses such a CAN-bus and/or wireless communication capabilities. The processing circuitry may be a general purpose processor or a specific processor. The electronic control unit 7 comprises a non-transitory memory for storing computer program code and data upon. Thus, the skilled addressee realizes that the electronic control unit 7 may be embodied by many different constructions.

According to the embodiment shown in FIG. 1, the energy storage system 4 is arranged on the roof of the bus 1. However, the invention is not limited to such an arrangement only, i.e. the energy storage system can be arranged in other locations such as the floor section of the bus 1. Also, even though this disclosure refers to a battery pack 5 used in a vehicle 1 in the form of a bus, it relates generally to controlling the status of a battery pack in any type of vehicle which is operated by means of at least an electric machine and which has an energy storage system comprising a battery pack with a number of battery cells.

During operation of the bus 1, the battery pack 5 will deliver the required electrical power to the electric machine 2, which in turn drives the rear axle 3. The manner in which an electric machine can be used for operating a vehicle is generally previously known and for this reason, it is not described in any greater detail here.

The bus 1 is equipped with a first electric connector element 8, suitably in the form of an electric connection socket which is mounted on an outside part of the bus 1. The first connector element 8 is arranged to be connected to a second electric connector element 9 in the form of a charging cable which is provided with a plug 9a which can be electrically connected to the first connector element 8 and which is configured for conducting a charging current at a certain voltage. The second electric connector element 9 forms part of an external power supply 10, which suitably is connected to an AC grid system as represented by a charging post as shown in FIG. 1. In this manner, the battery pack 5 can be supplied with an electrical current via the connector elements 8, 9. More precisely, the electric current is fed to an on-board charging unit 11 which is connected to the battery pack 5 for charging thereof. The control unit 7 is configured for controlling the charging procedure by means of a connection to the on-board charging unit 11. Also, a conversion of AC current to DC current suitable for the battery pack 5 can be provided either in the external power supply 10 or in the on-board charging unit 11.

According to an embodiment, charging of the battery pack 5 can take place while the bus 1 is standing still, i.e. either at a charging station at a bus terminal or at a bus stop or a similar position. In the described examples, a process for charging the battery pack 5 can be initiated when the bus is standing still so that the connector elements 8, 9 can be connected with each other. This means that charging of the battery pack 4 can be initiated after connection of the battery pack 4 to an external power supply 8, via the on-board charging unit 11.

It should be noted that other types of processes can be implemented for charging the battery pack 5 than shown in FIG. 1. For example, charging of the battery pack 5 can be implemented by means of a connector element in the form of a pantograph which is arranged on the roof of the vehicle and which is connected to an external power supply via an overhead wire.

According to a yet further embodiment, the charging process can be implemented by means of a current conducting power rail which is arranged along a road surface. Such an arrangement is configured to cooperate with one or more current collectors of the vehicle which are movable and lowered towards the ground, and which may be configured to be connected with said current conducting power rail during operation of the vehicle.

Figure 2:
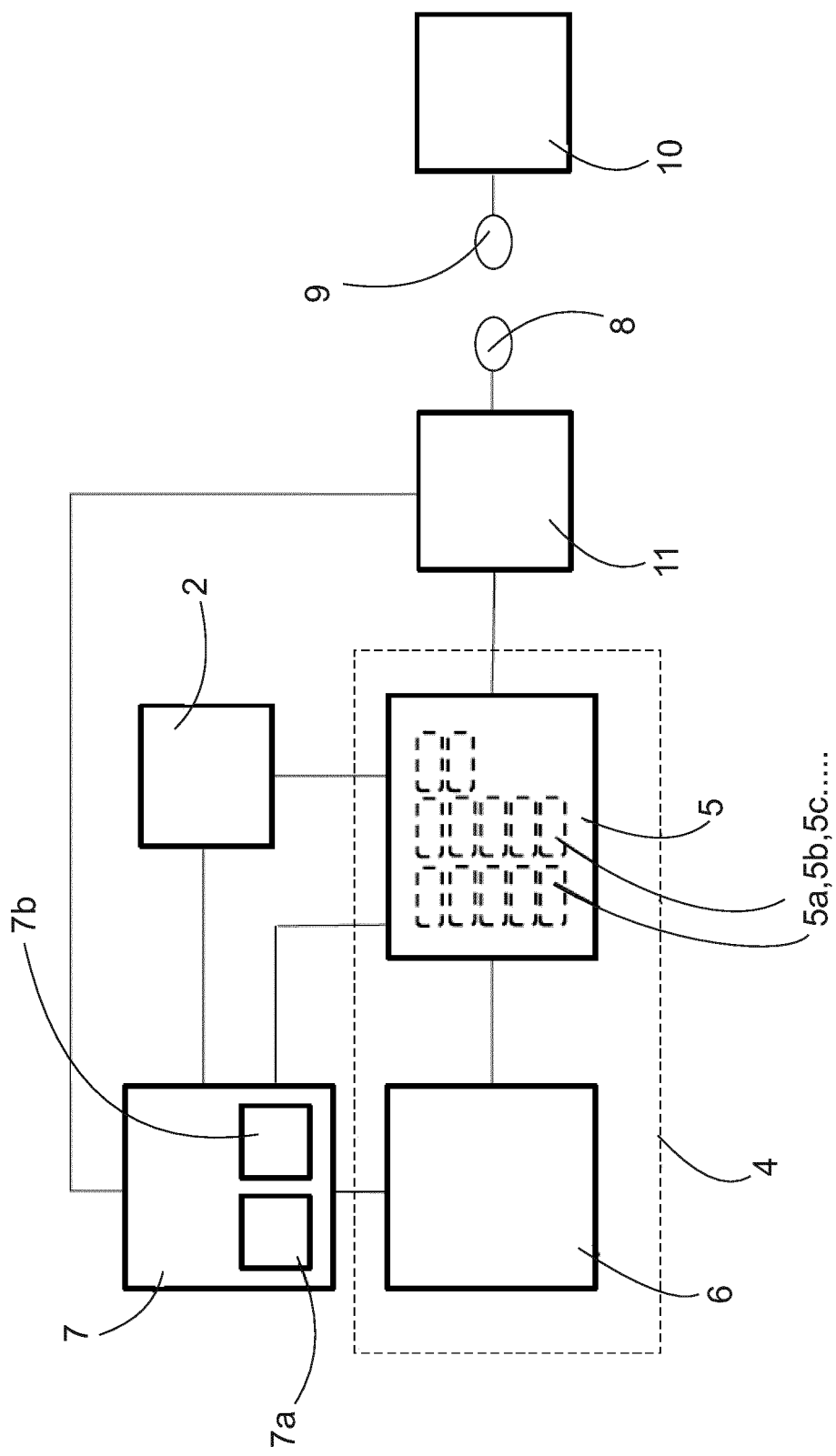
FIG. 2 is a schematic view of a battery management system for a vehicle in accordance with an embodiment of the invention.

An embodiment of the invention will now be described in greater detail with reference to FIG. 2, which is a simplified illustration of the energy storage system 4 and relevant components of the vehicle 1. All components shown in FIG. 1 are not shown in FIG. 2.

According to the embodiment, the energy storage system 4 comprises a battery pack 5 with a plurality of battery cells, symbolically represented by reference numerals 5a, 5b, 5c and being connected in series so as to provide an output battery voltage. The battery pack 5 contains a large number of battery cells, suitably in the magnitude of 50-500 cells, although the specific number may vary depending on the specifications of the energy storage system 4. According to the embodiment, the battery cells 5a, 5b, 5c are of the lithium-ion type, although the principles of the invention are equally applicable to other types of battery cells.

Also, although the embodiment comprises one single battery pack, it should be noted that the invention is also applicable in cases where two or more battery packs are combined in one single vehicle.

As mentioned above with reference to FIG. 1, the battery pack 5 is connected to an electric machine 2 and is configured for operating said electric machine 2, which in turn operates the vehicle in question. Furthermore, the battery pack 5 is connected to the on-board charging unit 11 so as to allow charging of the battery pack 5 when the charging unit 11 is connected to the external power supply 10. The external power supply 10 is typically configured for supplying a 400 V AC three-phase voltage. The charging unit 11 typically supplies a voltage of 700 V DC to the battery pack 5. However, alternative specifications are possible within the scope of the invention, such as an off-board charging unit.

Furthermore, the energy storage system 4 comprises the sensor unit 6 which is connected to the control unit 7. The sensor unit 6 is configured for measuring certain parameters associated with the battery pack 5. According to an embodiment, the sensor unit 6 is configured for measuring the cell voltage (V) of each battery cell and the voltage of the entire battery pack 5. Furthermore, the sensor unit 6 is configured for measuring the battery current (I), i.e. the current flowing through the series-connected battery cells 5a, 5b, 5c, as well as the temperature (T) of the battery pack 5. The measured temperature value represents the temperature at a suitable location within the battery pack 5, alternatively an average of several temperature values being measured at different locations within the battery pack 5.

The above-mentioned measurements of the current, voltage and temperature are generated by means of suitable sensor devices which are not shown in detail in the drawings. Furthermore, a purpose of the control unit 7 within the context of the invention is to serve as a battery management unit which controls the operation of the battery pack 5 and which also monitors the condition of the battery pack 5 with regard to certain parameters such as its state of charge (SOC), state of health (SOH) and similar parameters.

The control unit 7 is also configured to control the charging procedure of the battery pack 5. Suitably, the control unit 7 can also be configured to implement a battery cell balancing process, which is previously known as such and which is required when certain parameters such as the voltage of different battery cells 5a, 5b, 5c in the battery pack 5 differ between cells during the course of time. If cell balancing is not carried out, this may result in degraded battery properties.

A process for determining the state of charge (SOC) of the battery pack 5 will now be described. According to a first embodiment, a measurement of the voltage of each battery cell 5a, 5b, 5c, i.e. resulting in a measured voltage value $V_{meas}$, and a measurement of the battery current of the battery pack 5, i.e. resulting in a measured current value $I_{meas}$, can be provided by means of the sensor unit 6. Also, the voltage of the entire battery pack 5 is preferably determined by means of the sensor unit 6. As previously known, such measurements can be used for determining the state of charge (SOC) of the battery pack 5 and its battery cells. In this regard, it should be noted that using either one of the cell voltage or the battery current for determining the state of charge (i.e. instead of using measurements of both the cell voltage and battery current together) could be sufficient for the invention, but using both may provide a higher level of accuracy.

Also, according to the embodiment, and in order to further improve the accuracy of a process for determining the state of charge, a measured temperature value $T_{meas}$ may also be provided by means of the sensor unit 6 and is used in a process for determining the state of charge of the battery pack 4. By using the measured temperature value $T_{meas}$ in addition to the voltage or current measurements, an improved accuracy is provided.

In summary, in order to provide a very high degree of accuracy when determining the state of charge (SOC), measurements of both the cell voltage V and the battery current I, and also measurements of the battery temperature T, are used in a combined manner to determine the state of charge (SOC) of the battery pack 4. Such an embodiment will be described in greater detail below.

According to said embodiment, a value representing an estimated battery cell voltage $V_{est}$ during use of the battery pack 5 is determined by means of a cell model, suitably of the so-called equivalent circuit type. Such a type of cell model is generally known from different fields of technology and is used for describing the electric properties of a given circuit in order to simplify calculations related to the circuit in question. A cell model which may be used in accordance with this embodiment is shown in a schematical manner in FIG. 2 with reference numeral 7a, i.e. in the form of a cell model 7a forming part of the control unit 7. Using a cell model in the form of an equivalent circuit type means that the calculations related to the circuit can be simplified by means of differential equations.

According to a further embodiment, the invention can be implemented by means of a cell model of a further type such as an electrochemical model, in which partial differential equations or differential algebraic equations can be used to simplify the calculations of the circuit in question.

Figure 3:
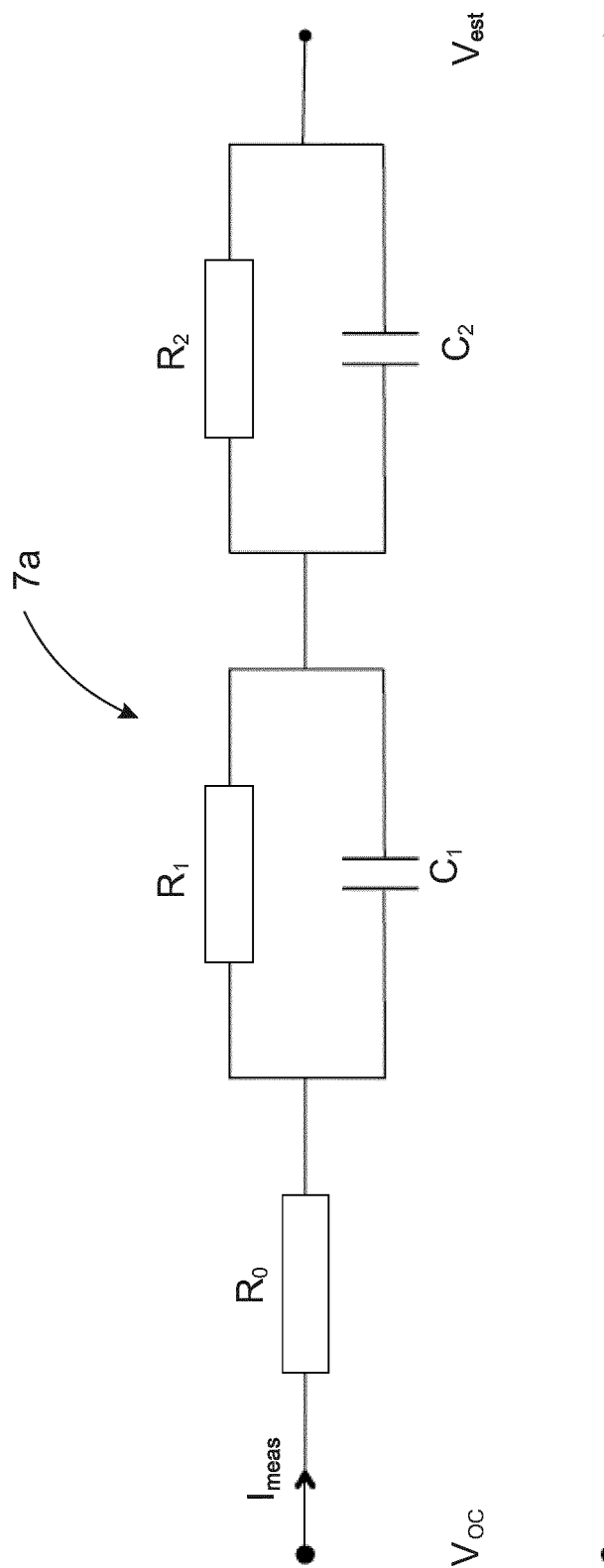
FIG. 3 is a schematic view describing an equivalent circuit being associated with the invention.

Furthermore, as shown in FIG. 3, the cell model 7a of an equivalent circuit of a battery cell 5a, 5b, 5c can be composed of passive elements such as resistors and capacitors which schematically are connected between two terminals representing an open circuit voltage $V_{OC}$ of a battery cell and two terminals representing an estimated voltage value $V_{est}$ of a battery cell. The cell model is associated with the control unit 7. Accordingly, the resistance $R_O$ in FIG. 3 corresponds to the ohmic resistance of the battery cell 5a, 5b, 5c, whereas the parallel-coupled resistance $R_1$ and capacitor $C_1$ can be seen to represent the short-term characteristics of a battery cell and the parallel-coupled resistance $R_2$ and capacitor $C_2$ can be seen to represent the long-term characteristics of a battery cell 5a, 5b, 5c.

As mentioned above, it is well-known that the state of charge (SOC) is a function of the open circuit voltage $V_{OC}$ of the battery cell 5a, 5b, 5c. This means that a value from a previous point time which indicates the state of charge $SOC_{prev}$ can be used for determining the open circuit voltage ($V_{OC}$) of the cell model 7b shown in FIG. 3. Assuming now that all values of the resistors $R_0$, $R_1$, $R_2$ and the capacitors $C_1$, $C_2$ in the cell model 7a are known, and also taking into account that the sensor unit 6 (see FIG. 2) provides a value of a measured battery current $I_{meas}$, an estimated value of the terminal voltage $V_{est}$ of the battery cell 5a, 5b, 5c can be calculated by the control unit 7.

Next, the sensor unit 6 provides a value of a measured voltage $V_{meas}$ of the battery cell 5a, 5b, 5c and feeds this value to the control unit 7. The measured voltage value $V_{meas}$ is compared with the estimated voltage value $V_{est}$. If the measured voltage value $V_{meas}$ differs from the estimated voltage value $V_{est}$, it can be assumed that the state of charge value $SOC_{est}$ is incorrect and needs to be updated.

The update of the state of charge value is carried out by means of a so-called observer function, which is a function which is previously known as such and which is used for determining estimates of a variable which is observed and updated over time. According to an embodiment, the observer function is constituted by a Kalman filter. Referring back to FIG. 2, this is schematically described as an observer module having reference numeral 7b and being associated with the control unit 7.

The invention is not limited to an observer function in the form of the above-mentioned Kalman filter only. In fact, and according to further embodiments, the invention can be implemented with an observer function in the form of a so-called Luenberger observer, or a sliding mode observer, or a variation of the Kalman filter, such as the extended Kalman filter and the unscented Kalman filter.

The general structure of a Kalman filter to be used in the observer module 7b comprises a factor representing the previous state of charge value $SOC_{prev}$ (i.e. registered at a previous point in time) and functions depending on measured values of the battery current $I_{meas}$ and the battery temperature $T_{meas}$, as provided by the sensor unit 6. The functions of the Kalman filter also comprise a so-called influence factor which controls the updating of the state of charge (SOC). More precisely, the value of the influence factor is used in the Kalman filter in order to control to what extent the state of charge estimations should be updated due to the newly estimated state of charge value $SOC_{est}$. In other words, the influence factor determines to which extent the measured voltage value $V_{meas}$, the measured current value $I_{meas}$ and the measured temperature value $T_{meas}$ will be taken into account during the updating of the state of charge.

According to an embodiment, the observer function can be arranged with the following structure:

$$x_{est} = x_{est}(t-dt) + f_1(x_{est}, u_{meas}) \cdot dt + K \cdot (y_{meas} - f_2(x_{est}))$$

where the state variable $x_{est}$ is based on the state of charge (SOC) values and the values of the voltages over the RC circuits in the cell model (see FIG. 3) and where the input variable $u_{meas}$ is based on the measured battery cell current $I_{meas}$ and the measured battery pack temperature $T_{meas}$. Also, the output variable $y_{meas}$ is based on the cell terminal voltage $V_{meas}$. Finally, the so-called observer gain K is a function which is based on the above-mentioned influence factor.

The amount of influence from the measured values $V_{meas}$, $T_{meas}$ on the updating of the state of charge, as opposed to the amount of influence from the cell model 7a itself, will be determined by means of the influence factor in the observer function. This means that the measured values, on the one hand, and the cell model 7a, on the other hand, can be given different priority during the process for updating the state of charge. Otherwise, if only the measured values are considered when updating the state of charge, there will be inaccuracies due to measurement errors, and if only the cell model 7a is taken into account, there will be inaccuracies due to a need for calibrating the cell model 7a after a certain time. For this reason, the influence factor can be used for an updating process of the state of charge in order to provide a high level of accuracy.

Figure 4:
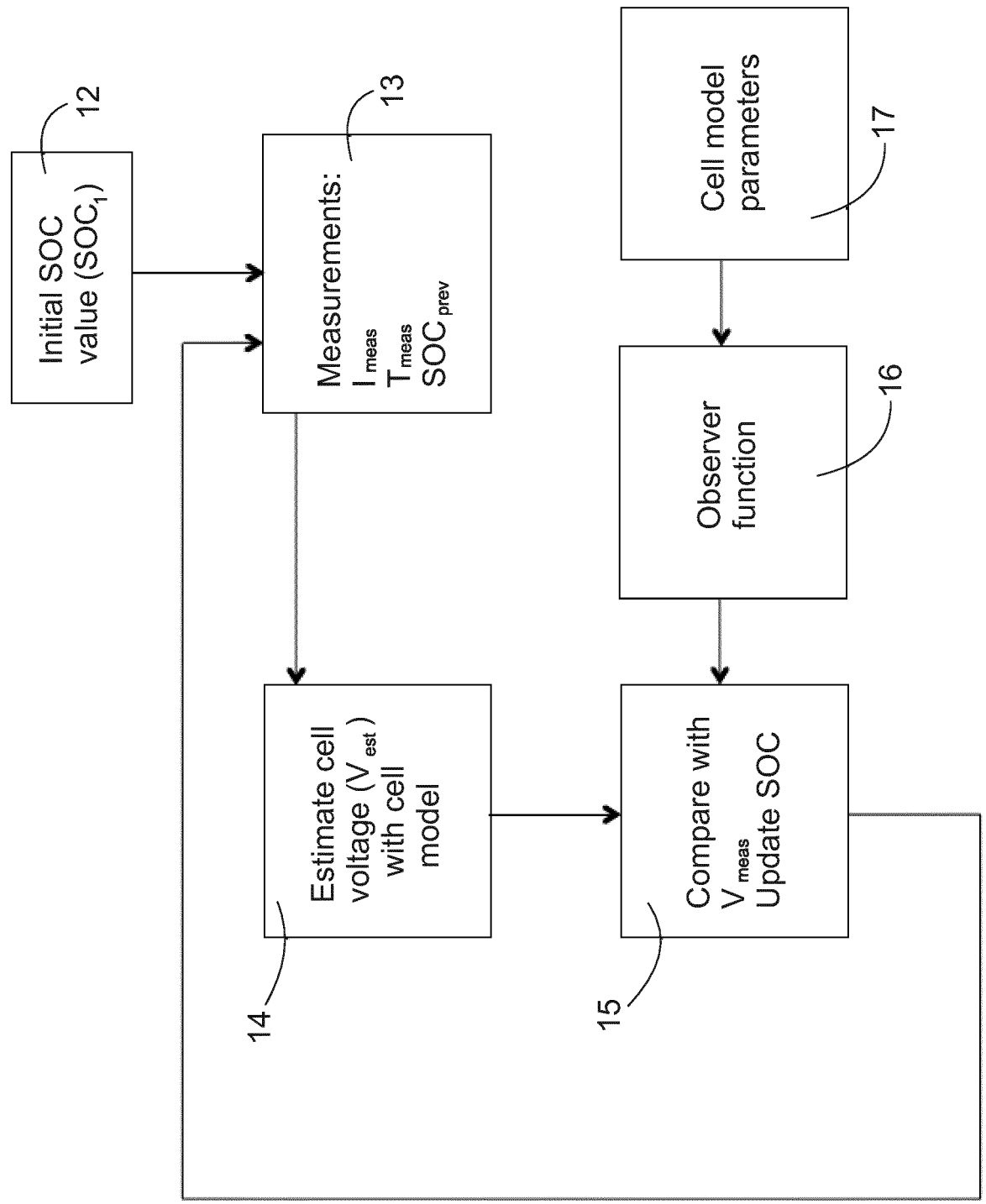
FIG. 4 is a flowchart illustrating the operation of an embodiment of the invention.

With reference to FIG. 4, the updating process will now be described by means of a flowchart in which there is assumed that said process starts from an initial state of charge value $SOC_1$ of the battery pack 5. This corresponds to a situation in which operation of the vehicle 1 (see FIG. 1) is started after a period in which the battery pack 5 has been charged to this initial value $SOC_1$. This situation is indicated with reference numeral 12 in FIG. 4.

The next step (reference numeral 13) is that input values to the cell model 7a representing the measured battery current $I_{meas}$ and the measured temperature $T_{meas}$ of the battery pack 4 (reference numeral 14), and also a previous state of charge value $SOC_{prev}$, are provided in the control unit 7. A "previous" state of charge value is obviously not available the very first time that the process shown in FIG. 4 is executed, but during all subsequent occasions that the process is executed. In other words, the value $SOC_{prev}$ is equal to the value $SOC_1$ at startup of the process.

Next, the above-mentioned cell model 7a is used for estimating a voltage value $V_{est}$ of a battery cell 5a, 5b, 5c (reference numeral 14), as described in the foregoing.

Next (reference numeral 15), the estimated battery cell voltage value $V_{est}$ is compared with the measured battery cell voltage value $V_{meas}$ in a manner so as to update the state of charge (SOC). This process is based on an observer function (reference numeral 16), i.e. by means of the above-mentioned observer module 7b in the control unit 7. Also, as described above, the observer function comprises an influence factor which is used to control the influence of the measurement values on the one hand, and the cell model 7a on the other hand, during the process of updating the state of charge. The influence factor can be said to represent errors in the state of charge used during the updating process.

According to an embodiment, the influence factor of the observer function is determined by the errors in the cell model 7a depending on the parameters of the cell model 7a (reference numeral 17). Consequently, the parametrization of the cell model 7a leads to certain errors, primarily in the form of random noise which can be classified into two types, either process noise or measurement noise. The process noise originates from the cell model 7a, for example in the form of noise in the RC circuits as shown in FIG. 3, whereas the measurement noise originates from the actual measurements of the cell terminal voltage, the battery current and the battery temperature.

Furthermore, and as mentioned above, the observer function is suitably a Kalman filter process, wherein the influence factor can be determined by means of the covariance of the process noise and the measurement noise which occurs when measuring said current $I_{meas}$, temperature $T_{meas}$ and voltage $V_{meas}$ of the battery pack. The covariance can be said to correspond to the estimated uncertainty of the predicted results of the updating process for the stage of charge.

As mentioned above, the parametrization of the cell model 7a is used to determine the influence factor. This can for example be used to adapt the influence factor to the temperature of the battery pack 5. If the battery pack 5 has a relatively low temperature, the influence factor is set so that the influence from the cell model 7a on the updating of the state of charge is relatively low. In other words, the measurements are trusted more than the cell model 7a. On the other hand, if the battery pack 5 has a relatively high temperature, the influence factor is set so that the influence from the cell model 7a on the updating of the state of charge is relatively high. Generally, the influence factor in the observer function can be used for limiting the update of the state of charge value.

Also, the influence factor can be controlled based on the temperature of said battery pack in a manner so that relatively large adjustments to the estimated state of charge (SOC) are allowed at a predetermined temperature interval. In this manner, a temperature interval can be selected for allowing such large adjustments.

Also, the influence factor can be controlled based on various parameters in order determine how much priority to give to the voltage, current and temperature measurements in relation to the cell model parameters. In general, it can be noted that the observer gain function K (see above) is a function which is based on the influence factor. The influence factor is defined by certain parameters of the cell model, in particular the battery current, the battery temperature and also the voltages of the different stages of the cell model.

Furthermore, the observer gain function K is calculated in a Kalman filter in an update phase. Such an update phase is as such previously known. Furthermore, the covariance of the process noise and the covariance of the measurement noise affect the observer gain function K. More precisely, the covariance of the process noise and the measurement noise reflect the uncertainty level in the cell model and in the measurements. If either one of the covariance of the process noise or the covariance of the measurement noise is modified, this will affect the predicted states in the Kalman filter, i.e. the SOC values. This means that the influence factor can be varied in order to affect the covariance of the process noise and the covariance of the measurement noise, depending on the above-mentioned parameters.

It is to be understood that the present invention is not limited to the embodiments described above and illustrated in the drawings; rather, the skilled person will recognize that many changes and modifications may be made within the scope of the appended claims.

For example, the vehicle 1 shown in FIG. 1 is arranged to be operated by means of an electric machine only. According to a further embodiment (not shown in the drawings), the vehicle may be a hybrid vehicle, for example a so-called plug-in hybrid vehicle which is equipped with both an internal combustion engine and an electric machine.

Furthermore, the cell model can be designed in various ways, i.e. with different types of RC branches having varying values depending on the structure of the battery pack in question and depending on requirements regarding the control process of the battery pack.

The invention claimed is:

1. A method for determining the state of charge of a chargeable battery pack comprising at least one battery cell, said method comprising the steps of: providing an initial state of charge value for said battery pack; estimating a battery cell voltage value using a cell model based on input values representing at least a measured voltage of said battery pack; comparing said estimated battery cell voltage value with said measured battery cell voltage value for said at least one battery cell; and determining an estimated state of charge value to update the state of charge from the initial state of charge value, based on said comparing step and by using an observer module; characterized in that: said observer module comprises an influence factor, said influence factor representing errors in the state of charge based on a parameterization of said cell model and limiting said update of the state of charge value by means of said influence factor.

2. A method according to claim 1, characterized by the further step of: determining said influence factor by a covariance of process noise defined by cell model noise and measurement noise occurring during measuring said temperature and voltage of said battery pack.

3. A method according to claim 1, characterized by the further step of: providing said observer module in the form of a Kalman filter.

4. A method according to claim 1, characterized by the further step of: estimating said battery cell voltage value using a cell model based on values representing also a previously estimated state of charge value.

5. A method according to claim 1, characterized by the further step of: defining said cell model in the form of an equivalent circuit model including resistors and capacitors.

6. A method according to claim 1, characterized by the further steps of: controlling the influence factor based on the temperature of said battery pack.

7. A non-transitory computer readable storage medium carrying a computer program comprising program code for performing the steps of claim 1 when said program is run on a computer.

8. A control unit for determining the state of charge of a chargeable battery pack, the control unit being configured to perform the steps of the method according to claim 1.

9. An arrangement for determining the state of charge of a chargeable battery pack comprising at least one battery cell, said arrangement comprising: a sensor unit for providing measured values representing at least a measured voltage of said battery pack; a control unit connected to said sensor unit and being configured for providing an initial state of charge value and for estimating a battery cell voltage value using a cell model based on said measured values, and for comparing said estimated battery cell voltage value with said measured battery cell voltage value for said at least one battery cell; and an observer module being associated with said control unit and allowing said control unit to update the state of charge by determining an estimated state of charge value based on said comparing step and by using said observer module; characterized in that the control unit is configured for controlling said updating by means of an influence factor being used in said observer module, said influence factor representing errors in the state of charge based on a parameterization of said cell model and limiting said update of the state of charge value by means of said influence factor.

10. A vehicle comprising an arrangement according to claim 9.

* * * * *